United States Patent
Shimizu et al.

(10) Patent No.: US 9,431,555 B2
(45) Date of Patent: Aug. 30, 2016

(54) SOLAR CELL AND METHOD FOR MANUFACTURING SAME

(71) Applicant: SANYO Electric Co., Ltd., Moriguchi-shi, Osaka (JP)

(72) Inventors: Sumito Shimizu, Osaka (JP); Tomohiro Saitou, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/496,238

(22) Filed: Sep. 25, 2014

(65) Prior Publication Data

US 2015/0007887 A1 Jan. 8, 2015

Related U.S. Application Data

(63) Continuation of application No. PCT/JP2013/057027, filed on Mar. 13, 2013.

(30) Foreign Application Priority Data

Mar. 30, 2012 (JP) ................................. 2012-080079

(51) Int. Cl.
- *H01L 31/18* (2006.01)
- *H01L 31/0236* (2006.01)
- *H01L 31/0224* (2006.01)

(52) U.S. Cl.
CPC . *H01L 31/02366* (2013.01); *H01L 31/022433* (2013.01); *H01L 31/022458* (2013.01); *H01L 31/18* (2013.01); *Y02E 10/50* (2013.01)

(58) Field of Classification Search
CPC ............... H01L 31/05; H01L 31/0504; H01L 31/0508; H01L 31/0516; H01L 31/1892; H01L 31/0463; H01L 31/022425; H01L 31/0236; H01L 31/022441; H01L 31/0682; H01L 31/60; H01L 31/046; H01L 31/0352; H01L 21/28; H01L 21/3213; H01L 21/76811; H01L 21/682; H01L 23/544; H01L 28/60; H01L 24/80; Y02E 10/50
USPC ........................................................ 136/256
See application file for complete search history.

(56) References Cited

U.S. PATENT DOCUMENTS

| | | | | |
|---|---|---|---|---|
| 6,096,569 A | * | 8/2000 | Matsuno et al. | ................. 438/19 |
| 2007/0164458 A1 | * | 7/2007 | Ogino et al. | .................. 257/797 |

FOREIGN PATENT DOCUMENTS

| | | | | |
|---|---|---|---|---|
| JP | 8-148709 A | | 6/1996 | |
| JP | 2009-200267 A | | 9/2009 | |
| WO | 2012/018119 A1 | | 2/2012 | |
| WO | WO 2012181119 | * | 2/2012 | .................... 136/256 |

* cited by examiner

*Primary Examiner* — Devina Pillay
*Assistant Examiner* — Daniel Malley, Jr.
(74) *Attorney, Agent, or Firm* — Cantor Colburn LLP

(57) ABSTRACT

A solar cell is provided with: an n-type region formed over a substrate; a p-type region formed over the substrate and the n-type region; and mark sets for judging positional deviation between the n-type region and the p-type region. The mark sets respectively include first marks, and second marks, which are formed within the first marks.

5 Claims, 19 Drawing Sheets

SOLAR CELL AND METHOD FOR MANUFACTURING SAME

CROSS-REFERENCE TO RELATED APPLICATIONS

The present application is a continuation under 35 U.S.C. §120 of PCT/JP2013/057027, filed Mar. 13, 2013, which is incorporated herein by reference and which claimed priority to Japanese Patent Application No. 2012-080079 filed on Mar. 30, 2012. The present application likewise claims priority under 35 U.S.C. §119 to Japanese Patent Application No. 2012-080079 filed on Mar. 30, 2012, the entire content of which is also incorporated herein by reference.

BACKGROUND

1. Technical Field

The present disclosure relates to a solar cell, and a method of manufacturing the same.

2. Related Art

In a solar cell, it is important to improve the photoelectric conversion efficiency. In consideration of such a situation, a back-contact type solar cell having a p-type semiconductor region and a p-side electrode, and an n-type semiconductor region and an n-side electrode formed over a back surface side of the solar cell is proposed (for example, JP 2009-200267 A). In the back-contact type solar cell, because no electrode exists on a light receiving surface side, a light receiving area for the solar light can be widened, and an amount of generation of power can consequently be increased.

In a solar cell of the back-contact type as described above or the like, there may be cases where a plurality of patterned thin film layers are stacked. In this case, the patterned layers must be aligned, and an alignment or positional deviation judging method suitable for the solar cell is desired.

SUMMARY

According to one aspect of the present disclosure, there is provided a solar cell comprising: a first patterned layer formed over a semiconductor substrate; a second patterned layer formed over at least one of the semiconductor substrate and the first patterned layer; and a mark set configured to judge a positional deviation between the first patterned layer and the second patterned layer, wherein the mark set includes: a first mark formed by providing a recess on the first patterned layer or by leaving the first patterned layer with an island shape; and a second mark formed by providing a recess on the second patterned layer or by leaving the second patterned layer with an island shape, and formed to fit within the first mark.

According to another aspect of the present disclosure, there is provided a method of manufacturing a solar cell having a mark set for judging a positional deviation between a first patterned layer and a second patterned layer, comprising: a first step in which the first patterned layer is formed over a semiconductor substrate, and a first mark included in the mark set is formed by providing a recess on the first patterned layer or by leaving the first patterned layer with an island shape; a second step in which the second patterned layer is formed over at least one of the semiconductor substrate and the first patterned layer, and a second mark included in the mark set is formed by providing a recess on the second patterned layer or by leaving the second patterned layer with an island shape; and a third step in which the positional deviation is judged by checking whether or not the second mark is positioned within the first mark without being placed out of the first mark.

ADVANTAGEOUS EFFECTS

According to various aspects of the present disclosure, in a solar cell having a plurality of patterned layers, the patterned layers can be efficiently aligned with each other.

DETAILED DESCRIPTION

Figure 1:
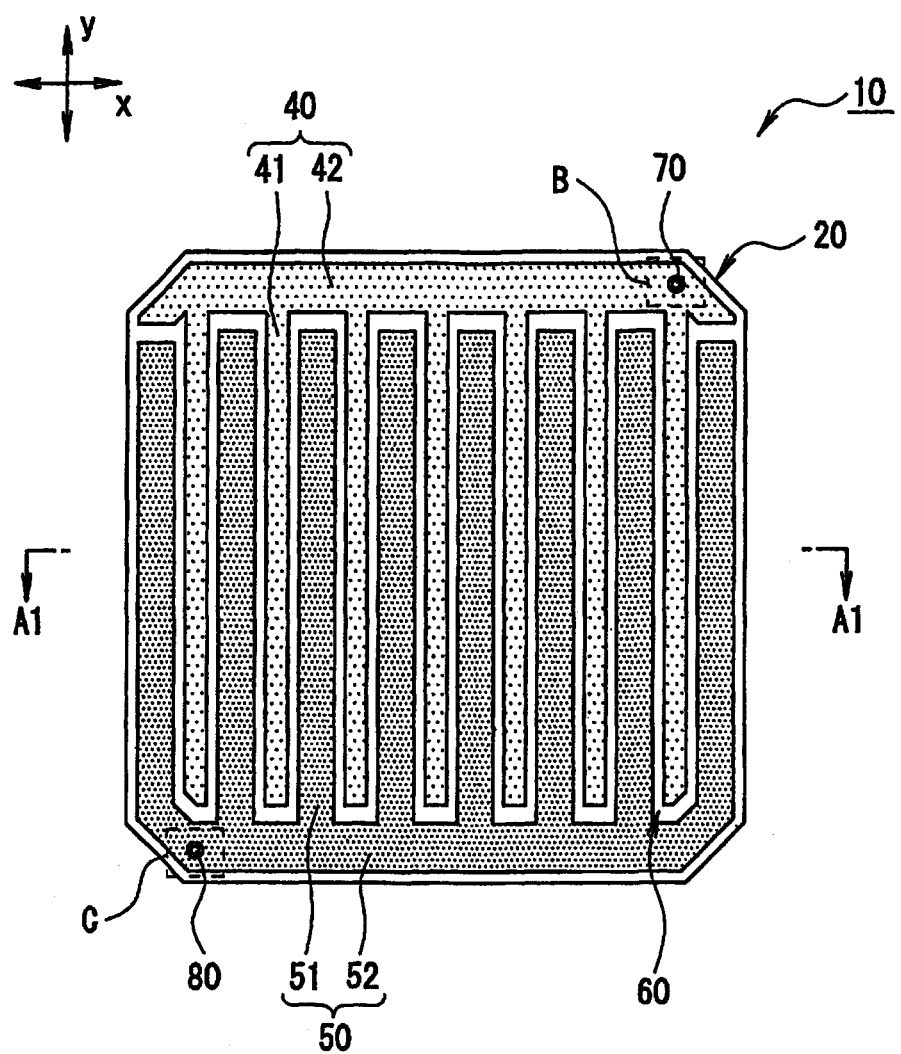
FIG. 1 is a plan view of a solar cell according to a preferred embodiment of the present disclosure, viewed from a back surface side.

A preferred embodiment of the present disclosure will now be described in detail with reference to the drawings.

The present disclosure is not limited to the below-described embodiment. Furthermore, the drawings referred to in the embodiment are schematically described, and the size, ratio or the like of the constituent elements drawn in the drawings may differ from those of the actual structures. The specific size, ratio, or the like should be determined based on the following description.

In the present specification, a description such as "a second object (such as, for example, an insulating layer) is formed over an entire region of a first object (for example, a semiconductor substrate)" is not intended to describe only a case where the first and second objects are formed in direct contact with each other, unless otherwise specified. That is, such a description includes a case where there is another object between the first and second objects. The description of "formed over an entire region" includes a case where the region can substantially be considered as the entire region (for example, a case where the object is formed over 95% of the first object).

In the present specification, a "planar view" refers to a planar shape (x-y plane) when the structure is viewed in a direction perpendicular to a light receiving surface. An "outline" of each mark forming the mark set refers to a line separating the mark and the outer environment in the planar view. Moreover, the description "a second mark fits within a first mark" refers to a state where the second mark exists in the first mark in the planar view and the outline of the first mark and the outline of the second mark are not in contact with each other.

A structure of a solar cell 10 will now be described in detail with reference to FIGS. 1-6.

Figure 2:
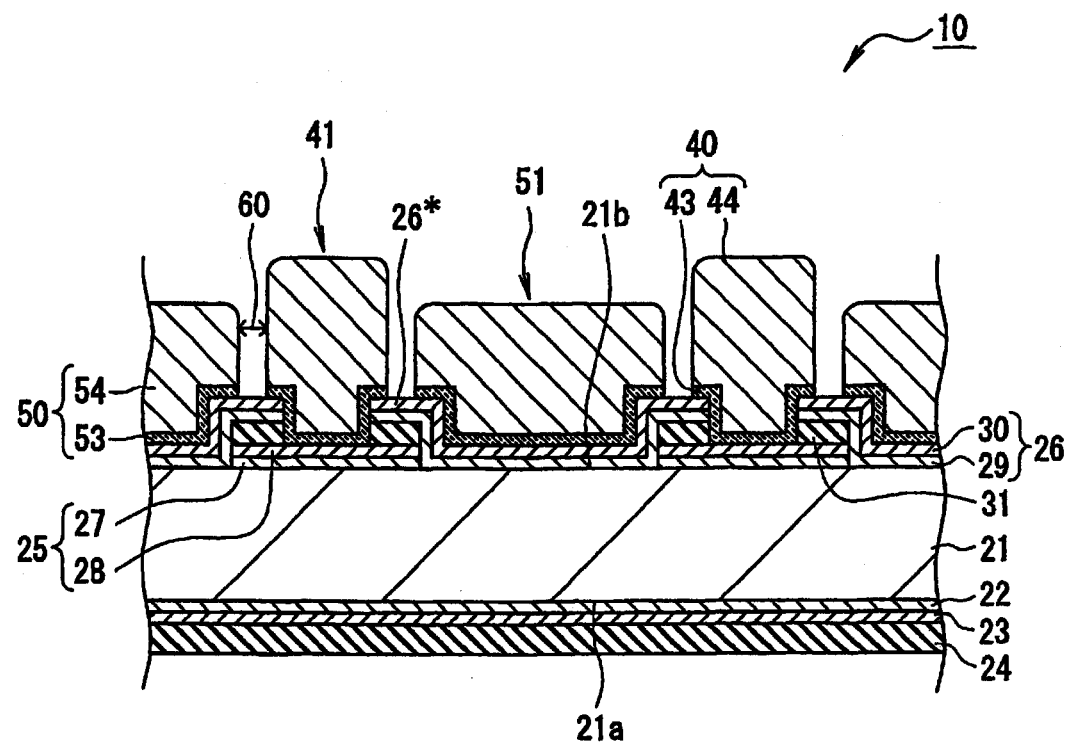
FIG. 2 is a cross sectional diagram along an A1-A1 line of FIG. 1.
Figure 3:
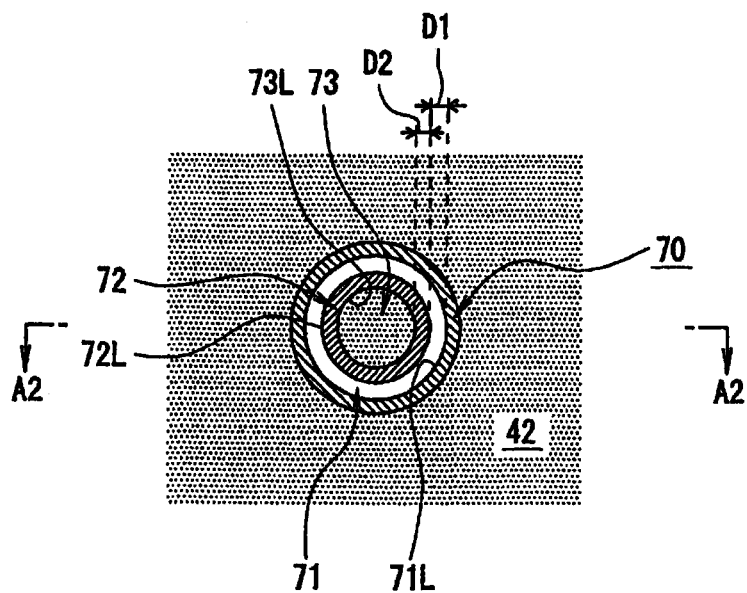
FIG. 3 is an enlarged view of a B-part of FIG. 1.
Figure 4:
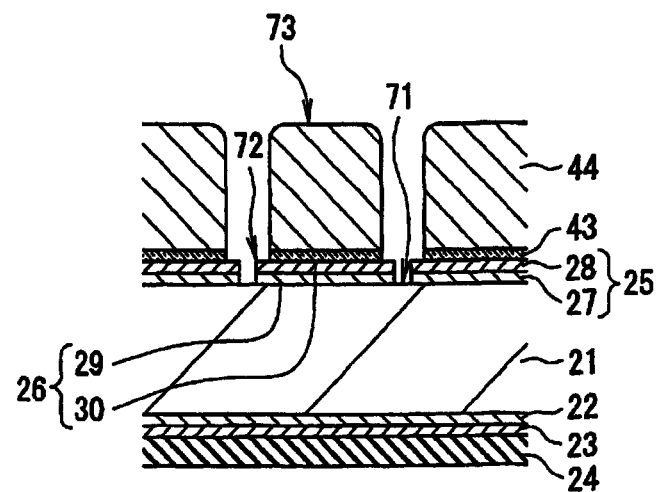
FIG. 4 is a cross sectional diagram along an A2-A2 line of FIG. 3.
Figure 5:
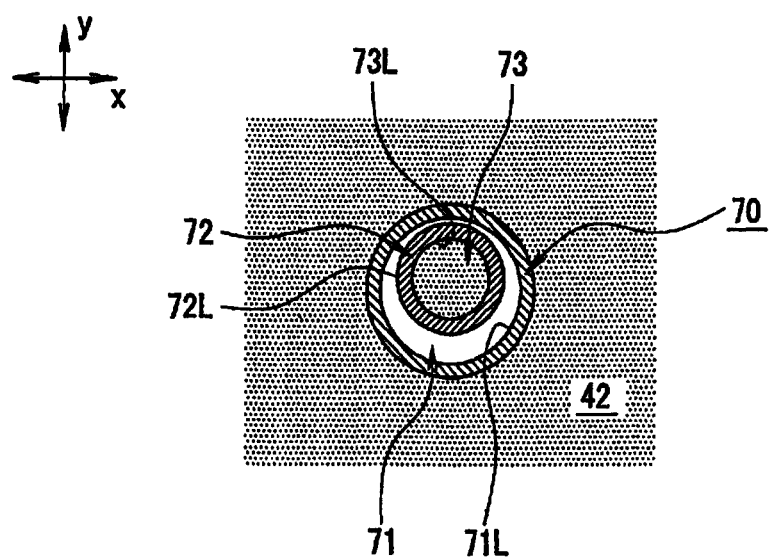
FIG. 5 is an enlarged view of the B-part of FIG. 1, and showing a situation where a second mark is shifted in the y direction.
Figure 6:
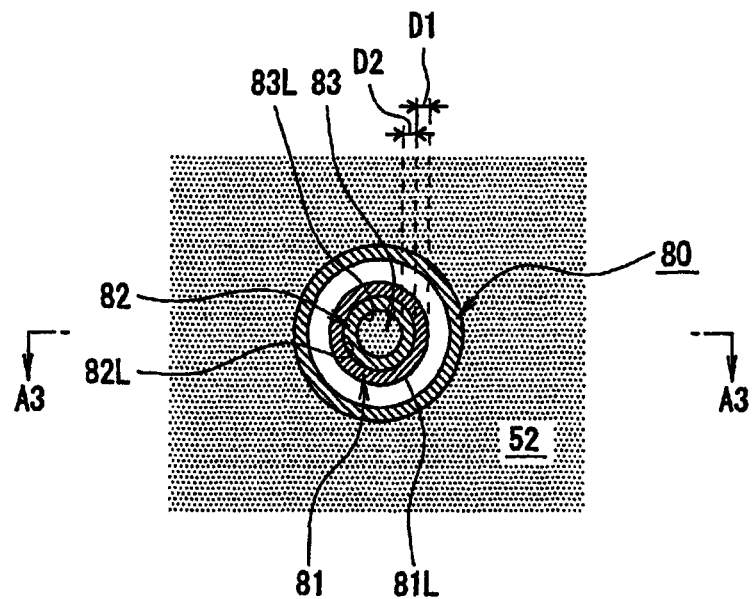
FIG. 6 is an enlarged view of a C-part of FIG. 1.
Figure 7:
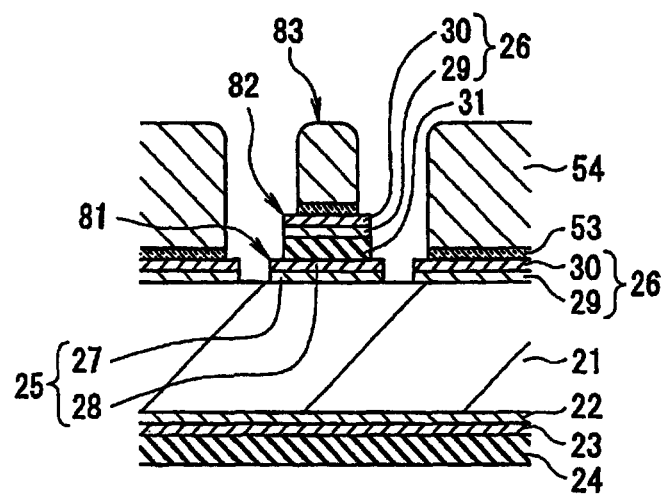
FIG. 7 is a cross sectional diagram along an A3-A3 line in FIG. 6.

FIG. 1 is a plan view of the solar cell 10 viewed from a back surface side. FIG. 2 is a diagram showing a part of a cross section along an A1-A1 line of FIG. 1, and shows a cross section in which the solar cell 10 is cut in the thickness direction along a width direction of finger portions 41 and 51. FIGS. 3-5 are diagrams showing a mark set 70 in an enlarged manner (FIGS. 3 and 5 being plan views and FIG. 4 being a cross sectional view). FIGS. 6 and 7 are diagrams showing a mark set 80 in an enlarged manner (FIG. 6 being a plan view and FIG. 7 being a cross sectional view).

The solar cell 10 comprises a photoelectric conversion unit 20 that receives solar light and generates carriers, and an n-side electrode 40 and a p-side electrode 50 formed over a back surface side of the photoelectric conversion unit 20.

In the solar cell 10, for example, the carriers generated at the photoelectric conversion unit 20 are collected respectively by the n-side electrode 40 and the p-side electrode 50. Here, a "back surface" of the photoelectric conversion unit 20 refers to a surface on a side opposite to a "light receiving surface" which is a surface in which the solar light enters from the outside of the solar cell 10. In other words, a surface over which the n-side electrode 40 and the p-side electrode 50 are formed is the back surface.

The photoelectric conversion unit 20 comprises a substrate 21 which is made of a semiconductor material such as, for example, crystalline silicon (c-Si), gallium arsenide (GaAs), indium phosphide (InP), or the like. As the substrate 21, a crystalline silicon substrate is preferable, and an n-type monocrystalline silicon substrate is particularly preferable.

Over a light receiving surface 21a of the substrate 21, an i-type amorphous semiconductor layer 22, an n-type amorphous semiconductor layer 23, and a protection layer 24 are sequentially formed. These layers are formed, for example, over the entire region other than an end edge region over the light receiving surface 21a.

The i-type amorphous semiconductor layer 22 and the n-type amorphous semiconductor layer 23 function as a passivation layer. As the i-type amorphous semiconductor layer 22, a thin film layer formed of i-type amorphous germanium or i-type amorphous silicon may be exemplified. Preferably, the i-type amorphous semiconductor layer 22 is an i-type amorphous silicon layer and has a thickness of about 0.1 nm-25 nm. As the n-type amorphous silicon layer 23, a thin film layer formed of amorphous silicon carbide, amorphous silicon germanium, or amorphous silicon doped with phosphorous (P) or the like may be exemplified. Preferably, the n-type amorphous semiconductor layer 23 is an amorphous silicon layer doped with phosphorous (P) or the like and has a thickness of about 2 nm-50 nm.

The protection layer 24 has a function to protect the passivation layer and also to prevent reflection of the solar light. The protection layer 24 is preferably formed of a material having a high light transmission characteristic. More specifically, a metal compound layer such as silicon oxide (SiO or $SiO_2$), silicon nitride (SiN), SiON, or the like is preferable, and a SiN layer is particularly preferable. A thickness of the protection layer 24 can be suitably changed in consideration of the reflection prevention characteristic or the like, and is, for example, about 80 nm-1 μm.

Over the back surface 21b of the substrate 21, an n-type region 25 and a p-type region 26 are formed, respectively. The n-type region 25 and the p-type region 26 are preferably formed in a stripe shape extending in one direction (y direction), covering a wide area over the back surface 21b, for example, from the viewpoint of the photoelectric conversion characteristic or the like. More specifically, the n-type region 25 and the p-type region 26 are preferably placed in an alternating manner, and formed without a gap therebetween (the direction in which the n-type region 25 and the p-type region 26 are alternately placed being the x direction). The region between the n-type region 25 and an overlap region 26* is insulated by an insulating layer 31.

As will be described in detail later, in the configuration exemplified in FIG. 2, in order to alternately place the n-type region 25 and the p-type region 26 and form the regions without a gap therebetween, it is necessary to align the n-type region 25 which is a first patterned layer and the p-type region 26 which is a second patterned layer. Alternatively, the order of layering of the n-type region 25 and the p-type region 26 may be reversed.

The n-type region 25 is an amorphous semiconductor layer formed directly over the back surface 21b. The n-type region 25 has a layered structure in which an i-type amorphous semiconductor layer 27 and an n-type amorphous semiconductor layer 28 are sequentially formed. Alternatively, the n-type region 25 may be formed with only the n-type amorphous semiconductor layer 28, but from the viewpoint of the passivation characteristic, it is preferable to provide the i-type amorphous semiconductor layer 27. The i-type amorphous semiconductor layer 27 and the n-type amorphous semiconductor layer 28 can be formed, for example, with a similar composition and a similar thickness to those of the i-type amorphous semiconductor layer 22 and the n-type amorphous semiconductor layer 23, respectively.

The p-type region 26 is an amorphous semiconductor layer formed directly over the back surface 21b and the insulating layer 31. The p-type region 26 has a layered structure in which an i-type amorphous semiconductor layer 29 and a p-type amorphous semiconductor layer 30 are sequentially formed. Similar to the n-type region 25, alternatively, the p-type region 26 may be formed with only the p-type amorphous semiconductor layer 30, but from the viewpoint of the passivation characteristic, provision of the i-type amorphous semiconductor layer 29 is preferable. The i-type amorphous semiconductor layer 29 may be formed, for example, with a similar composition and a similar thickness to those of the i-type amorphous semiconductor layer 27. As the p-type amorphous semiconductor layer 30, an amorphous silicon layer doped with boron (B) or the like is preferable. A thickness of the p-type amorphous semiconductor layer 30 is preferably about 2 nm-50 nm.

The insulating layer 31 is formed over a part of the n-type amorphous semiconductor layer 28 of the n-type region 25 in a predetermined pattern. More specifically, in a region where the n-type amorphous semiconductor layer 28 and the p-type amorphous semiconductor layer 30 are overlapped (hereinafter referred to as an "overlap region 26*"), the insulating layer 31 is formed only between the n-type amorphous semiconductor layer 28 and the p-type amorphous semiconductor layer 30. The insulating layer 31 is formed from a metal compound having a superior insulating characteristic. Preferable metal compounds include $SiO_2$, SiN, SiON, alumina ($Al_2O_2$), aluminum nitride (AlN), or the like. A thickness of the insulating layer 31 is preferably about 30 nm-500 nm.

As described above, the solar cell 10 includes the n-side electrode 40 and the p-side electrode 50 which are electrode layers. The n-side electrode 40 is an electrode that collects carriers (electrons) from the n-type region 25 of the photoelectric conversion unit 20, and is provided in a pattern corresponding to the n-type region 25. The p-side electrode 50 is an electrode that collects carriers (holes) from the p-type region 26 of the photoelectric conversion unit 20, and is provided in a pattern corresponding to the p-type region 26. Between the n-side electrode 40 and the p-side electrode 50, a separation groove 60 for preventing electrical contact therebetween is formed.

As will be described in detail later, in the configuration exemplified in FIG. 2, when the pattern of the n-side electrode 40 is formed over the n-type region 25 and the pattern of the p-side electrode 50 is formed over the p-type region 26, an alignment between the p-type region 26 which is the second patterned layer and the electrode layer which is a third patterned layer is necessary. In the present embodiment, a contact region of the n-type region 25 and the n-side electrode 40 is formed by patterning the p-type region 26, and the n-side electrode 40 and the p-side electrode 50 are formed by patterning a transparent conductive layer 32. Because of this, it is only necessary to align both of the n-side electrode 40 and the p-side electrode 50 with respect to the p-type region 26.

The n-side electrode 40 and the p-side electrode 50 include a plurality of finger portions 41 and 51, and bus bar portions 42 and 52 connecting corresponding finger portions, respectively. The finger portions 41 and 51 have a comb shape interdigitating with each other with the separation groove 60 therebetween in the planar view. In addition, the n-side electrode 40 and the p-side electrode 50 have a multilayer structure in which transparent conductive layers 43 and 53 and metal layers 44 and 54 are sequentially formed, respectively.

Each of the transparent conductive layers 43 and 53 is formed from a transparent conductive oxide (hereinafter referred to as "TCO") in which a metal oxide such as indium oxide ($In_2O_3$), zinc oxide (ZnO) or the like having a polycrystalline structure is doped with tin (Sn), antimony (Sb), or the like. A thickness of each of the transparent conductive layers 43 and 53 is preferably about 30 nm-500 nm.

The metal layers 44 and 54 are preferably formed from a metal having a high electrical conductivity and a high reflectance of light. More specifically, metals such as copper (Cu), silver (Ag), aluminum (Al), nickel (Ni), or the like and alloys of one or more of these metals may be exemplified. In consideration also of the material cost, of these materials, Cu is particularly preferable. Thicknesses of the metal layers 44 and 54 are preferably about 50 nm-1 μm.

The solar cell 10 further includes mark sets 70 and 80 for judging a positional deviation of the plurality of patterned layers. In the solar cell 10, the mark set 70 is provided in a region where the bus bar portion 42 is formed, and the mark set 80 is provided in a region where the bus bar portion 52 is formed. The mark sets 70 and 80 are positioned at diagonal positions of the back surface 21b. By providing the mark sets in this manner, it becomes possible to judge the positional deviation (so-called shift) in xy directions, and also, it becomes possible to judge positional deviation due to rotation and the positional deviation due to non-linear distortion of the substrate 21, by providing the plurality of mark sets on the same surface.

As shown in FIGS. 3 and 4, the mark set 70 includes a first mark 71 formed by providing a recess in the n-type region 25 which is the first patterned layer, and a second mark 72 formed by leaving the p-type region 26 which is the second patterned layer with an island shape and in a manner to fit within the first mark 71. In other words, the mark set 70 is provided within the n-type region 25. The second mark 72 is formed directly over the back surface 21b, distanced from the surrounding n-type region 25. The mark set 70 further includes a third mark 73 formed by leaving the electrode layer which is the third patterned layer (the transparent conductive layer 43 and the metal layer 44) in an island shape and in a manner to fit within the second mark 72. Because the transparent conductive layer 43 and the metal layer 44 have the same pattern in the planar view, for example, alternatively, the third mark 73 only on the transparent conductive layer 43 may be used.

The mark set 70 is provided on an opening of the bus bar portion 42. On an outer side of the first mark 71, a region in which the electrode layer is not formed is present, and a ring-shaped n-type region 25 is exposed in this region. With this structure, it is possible to prevent contact of the electrode layer with the substrate 21 even when the electrode layer is slightly deviated from the target layering position.

The marks in the mark set 70 have a circular shape in the planar view, and differ from each other only in the size thereof. When a circular shape is employed for the marks in the planar view in this manner, for example, in a case where the p-type region 26 is shifted in the x and y directions from the target layering placement, a portion is created where a gap D1 to be described later becomes the shortest (refer to FIG. 5). With this configuration, a degree of positional deviation (amount of deviation) and direction of deviation can be easily checked. The shape of the marks is not limited to a circular shape, and may alternatively be other shapes such as a polygon shape including a quadrangular shape, an elliptical shape, a cross shape, or the like, as will be described later.

In the configuration exemplified in FIG. 3, the centers of the marks of the mark set 70 are made to coincide with each other. The gap D1 between an outline 71L of the first mark 71 and an outline 72L of the second mark 72 is uniform over the entire perimeter of the second mark 72. In addition, a gap D2 between the outline 72L of the second mark 72 and an outline 73L of the third mark 73 is also uniform over the entire perimeter of the third mark 73. Normally, a center of the first mark 71 is set as a target of alignment of the patterned layers. In other words, the solar cell 10 having the mark set 70 shown in FIG. 3 (when the mark set 80 also has the configuration shown in FIG. 6) has the n-type region 25, the p-type region 26, and the electrode layer which are aligned at a target precision.

On the other hand, as shown in FIG. 5, there may be a case where the centers of the marks do not coincide with each other. In the configuration exemplified in FIG. 5, the center of the second mark 72 is shifted in the y direction from the center of the first mark 71, and the gap D1 between the outlines 71L and 72L is not uniform. In other words, the solar cell 10 having the mark set 70 shown in FIG. 5 has the p-type region 26 which is deviated in the y direction from the target layering placement with respect to the n-type region 25.

Here, the gap D1 between the outlines 71L and 72L preferably defines a tolerable value for the positional deviation between the n-type region 25 and the p-type region 26. Similarly, the gap D2 between the outlines 72L and 73L preferably defines a tolerable value for the positional deviation between the p-type region 26 and the electrode layer. In this case, for example, contact between the outlines 71L and 72L indicates that there is a positional deviation between the n-type region 25 and the p-type region 26 exceeding the tolerable value. The tolerable value for the positional deviation (that is, gaps D1 and D2) is determined in consideration of, for example, the performance and yield of the solar cell 10. The tolerable value is not limited to a particular value, but for the case of the solar cell 10 of the back-contact type, the tolerable value is preferably about a few μm to a few tens of μm.

As shown in FIGS. 6 and 7, the mark set 80 includes a first mark 81 formed by leaving the n-type region 25, which is the first patterned layer, with an island shape, and a second mark 82 formed by leaving the p-type region 26, which is the second patterned layer, with an island shape and in a manner to fit within the first mark 81. Between the n-type region 25 and the p-type region 26, the insulating layer 31 formed in the same pattern as the p-type region 26 is present. The first mark 81 is surrounded by the p-type region 26 in its entire perimeter and is formed directly over the back surface 21b distanced from the p-type region 26. In other words, mark set 80 is provided within the p-type region 26. In addition, the mark set 80 includes a third mark 83 formed by leaving the electrode layer (the transparent conductive layer 53 and the metal layer 54), which is the third patterned layer, with an island shape and in a manner to fit within the second mark 82.

In the mark set 80 also, the marks have a circular shape in the planar view, and the centers of the marks coincide with each other. In addition, a gap between outlines 81L and 82L is set to D1 and a gap between outlines 82L and 83L is set to D2.

Alternative configurations of the mark set 70 and the placement thereof will now be described with reference to FIGS. 8-12. Marks shown in FIGS. 8-10 have the layered structure shown in FIG. 4, and differ from each other only in the shape in the planar view (in FIGS. 8 and 9, only the first mark 71 and the second mark 72 are shown). Here, for the purpose of the explanation, the elements forming the same layers are assigned the same reference numerals, and will not be described again.

Figure 8:
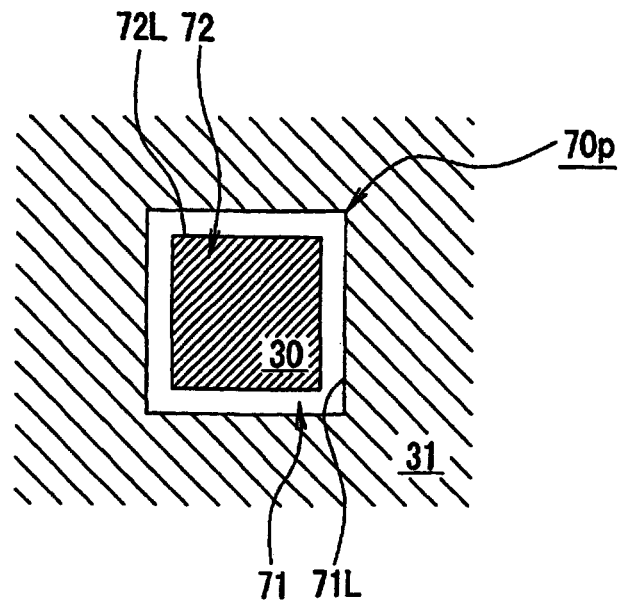
FIG. 8 is a diagram showing a first alternative configuration of a mark set in a solar cell according to a preferred embodiment of the present disclosure.

A mark set 70p shown in FIG. 8 includes a first mark 71 and a second mark 72 having a quadrangle shape in the planar view. The marks are, for example, squares in the planar view. A gap between an outline 71L of the first mark 71 and an outline 72L of the second mark 72 is uniform over the entire perimeter of the second mark 72 in a state where the centers of the marks coincide. With the use of the first mark 71 and the second mark 72 having quadrangular shapes in the planar view, it becomes easier to judge the positional deviation due to rotation, compared to a case where marks having a circular shape in the planar view are used.

Figure 9:
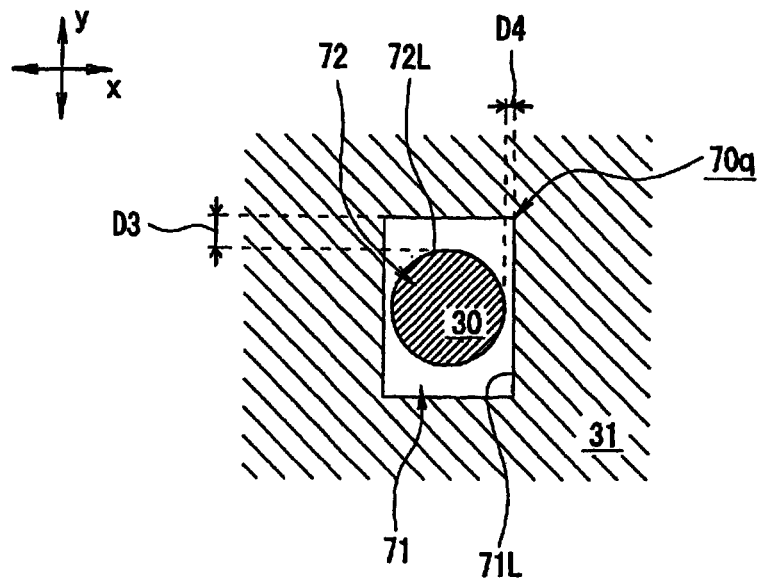
FIG. 9 is a diagram showing a second alternative configuration of a mark set in a solar cell according to a preferred embodiment of the present disclosure.

A mark set 70q shown in FIG. 9 includes a first mark 71 and a second mark 72 having shapes different from each other in the planar view. In the mark set 70q, the gaps between the outlines 71L and 72L differ in one direction (y direction) passing through a center of the first mark 71 and a second direction which is orthogonal to the one direction (x direction). More specifically, the first mark 71 has a rectangular shape in the planar view, the second mark 72 has a circular shape in the planar view, and the first mark 71 extends longer in the y direction. In a state where the centers of the marks coincide, a gap D3 in the y direction is wider than a gap D4 in the x direction. In this case, the tolerable value for the positional deviation between the n-type region 25 and the p-type region 26 differs depending on the direction, and is set larger in the y direction than in the x direction.

Figure 10:
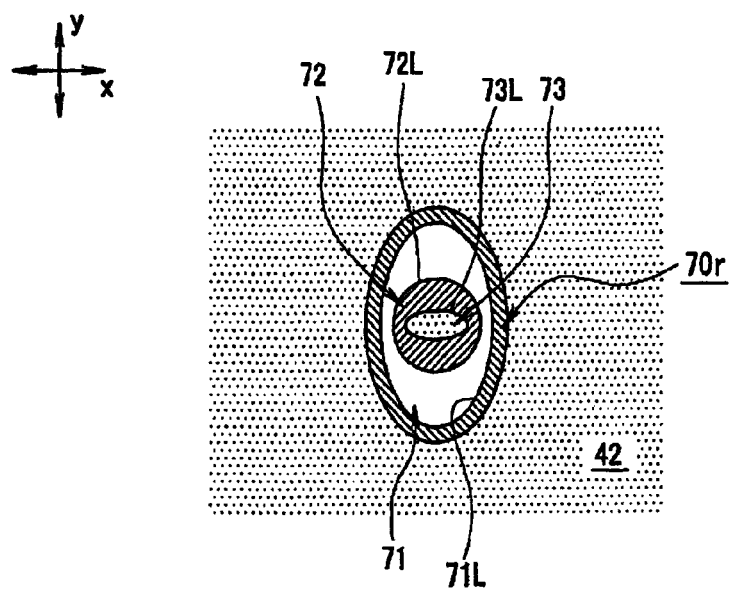
FIG. 10 is a diagram showing a third alternative configuration of a mark set in a solar cell according to a preferred embodiment of the present disclosure.

Similar to the mark set 70q, a mark set 70r shown in FIG. 10 includes a first mark 71, a second mark 72, and a third mark 73 having shapes different from each other in the planar view. The first mark 71 and the third mark 73 have an elliptical shape in the planar view. However, the major axis directions of the ellipses are orthogonal to each other, with the major axis direction of the first mark 71 being parallel to the y direction and the major axis direction of the third mark 73 being parallel to the x direction. The second mark 72 has a circular shape in the planar view. In other words, the tolerable value for the positional deviation between the n-type region 25 and the p-type region 26, and the tolerable value for the positional deviation between the p-type region 26 and the electrode layer are set to be larger in the y direction than in the x direction.

In the solar cell 10, preferably, the alignment precision is set higher in the x direction along which the n-type region 25 and the p-type region 26 are alternately placed than in the y direction. That is, in the solar cell 10, because the degree of positional deviation that can be tolerated differs depending on the direction over the back surface 21b, it is preferable to employ different lengths of the marks corresponding to the directions. With such a configuration, an efficient alignment suited for the solar cell 10 can be achieved.

Figure 11:
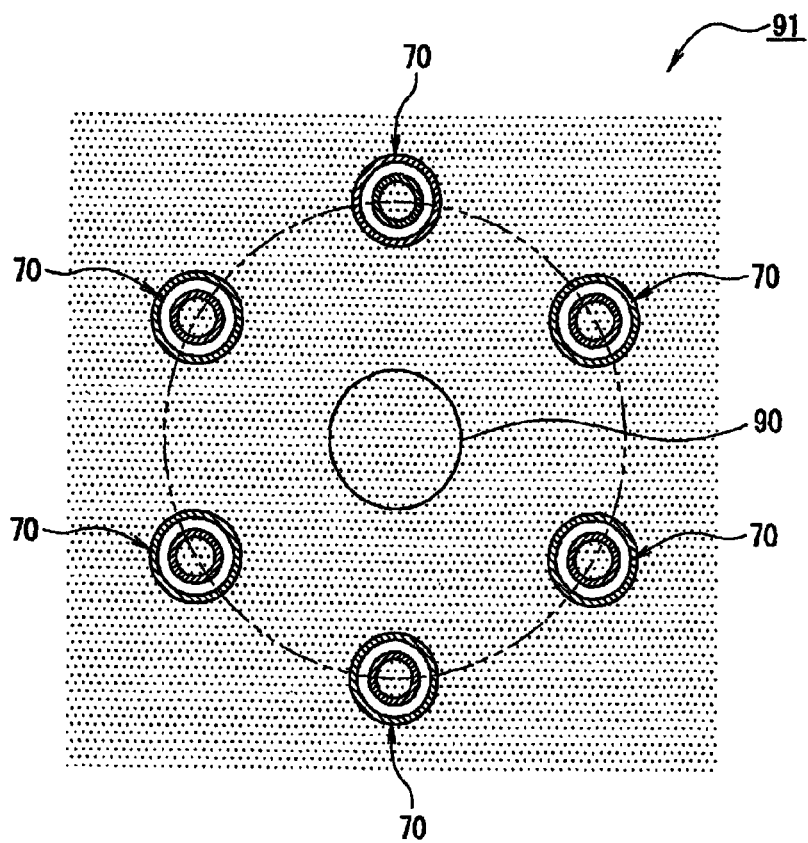
FIG. 11 is a diagram showing a fourth alternative configuration of a mark set in a solar cell according to a preferred embodiment of the present disclosure.

In an example configuration shown in FIG. 11, a mark set group 91 is formed by placing a plurality of mark sets 70 on a concentric circle around a center circle 90. The center circle 90 is a mark formed as an index mark when the mark set group 91 is to be formed, and formed, for example, by machining the back surface 21b with laser or the like. In the mark set group 91, a plurality of mark sets 70 are placed on the concentric circle with equal spacing, and each mark set has the same size. By placing the plurality of mark sets 70 on the concentric circle in this manner, for example, it is possible to judge the positional deviation due to rotation, in addition to the positional deviation due to shift, without the need for checking the mark set 80.

Figure 12:
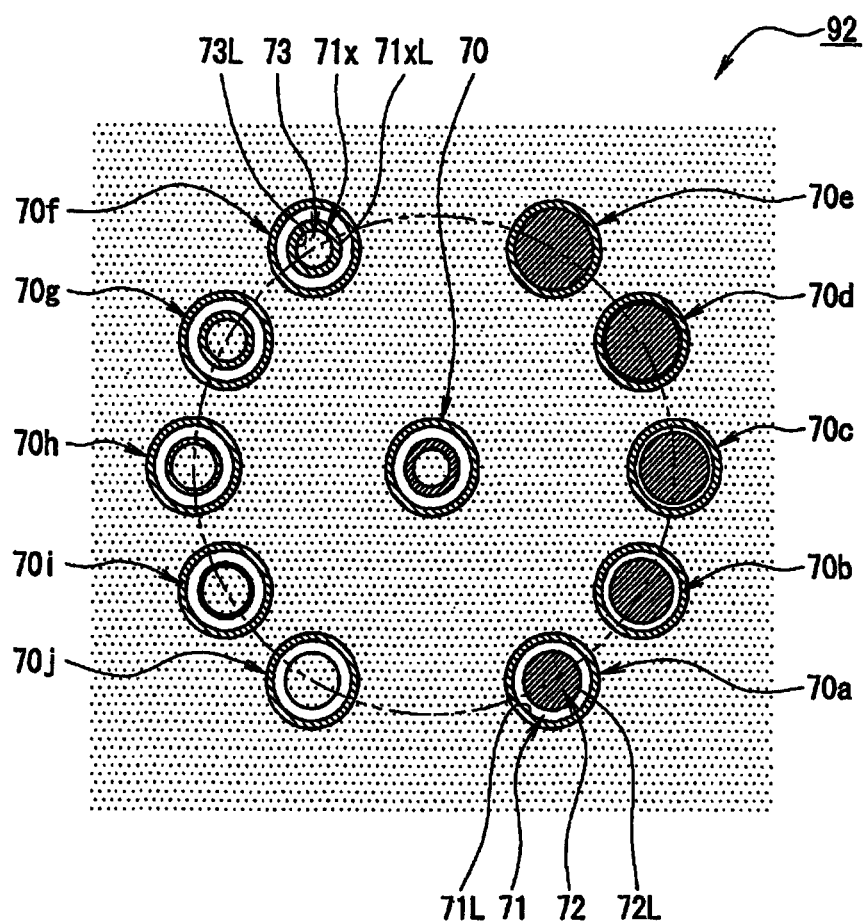
FIG. 12 is a diagram showing a fifth alternative configuration of a mark set in a solar cell according to a preferred embodiment of the present disclosure.

In an example configuration shown in FIG. 12, a plurality of mark sets 70a-70j are placed on a concentric circle around the mark set 70, to form a mark set group 92. The mark sets 70a-70e include a first mark 71 and a second mark 72, and are used for judging positional deviation between the n-type region 25 and the p-type region 26. On the other hand, the mark sets 70f-70j include a first mark 71x and a third mark 73, and are used for judging the positional deviation between the n-type region 25 and the electrode layer. The first mark 71x has a form in which an island made of the n-type region 25 is formed in a recess provided on the n-type region 25. With such a configuration, in a case where three or more patterned layers are layered, it is possible to easily judge in which layer the positional deviation exists.

In the mark sets 70a-70e, gaps between the outline 71L of the first mark 71 and the outline 72L of the second mark 72 differ from each other. The gaps are set to be widest for the mark set 70a, and to become narrower toward the mark set 70e, and to zero, for example, for the mark set 70e. With such a configuration, the amount of deviation and the direction of deviation of alignment can be quickly judged. For example, when the outlines 71L and 72L contact each other at the mark set 70d (with a gap of d) and the outlines 71L and 72L do not contact each other in the mark set 70c (with a gap of c), the amount of deviation can be immediately known to be greater than or equal to d and less than c. Similarly, in the mark sets 70f-70j, the gaps between the outlines 71Lx and 72L are set to differ from each other.

The forms exemplified in FIGS. 8-12 can be applied also to the mark set 80. In addition, in the above, a configuration is described in which the second and third patterned layers are left in the island shape to form the second and third marks, but alternatively, recesses may be provided on the second and third patterned layers to form the second and third marks.

A method of manufacturing the solar cell 10 having the above-described structure will now be described with reference to FIGS. 13-25. Here, a configuration is described in which an amorphous silicon layer is employed as the amorphous semiconductor layer such as the i-type amorphous semiconductor layer 22, and SiN layers are employed as the protection layer 24 and the insulating layer 31.

In FIGS. 13-25 (except for FIGS. 20 and 21), cross sections corresponding to an A2-A2 line cross section, an A1-A1 line cross section, and an A3-A3 line cross section during the manufacture of the solar cell 10 are shown.

Figure 13:
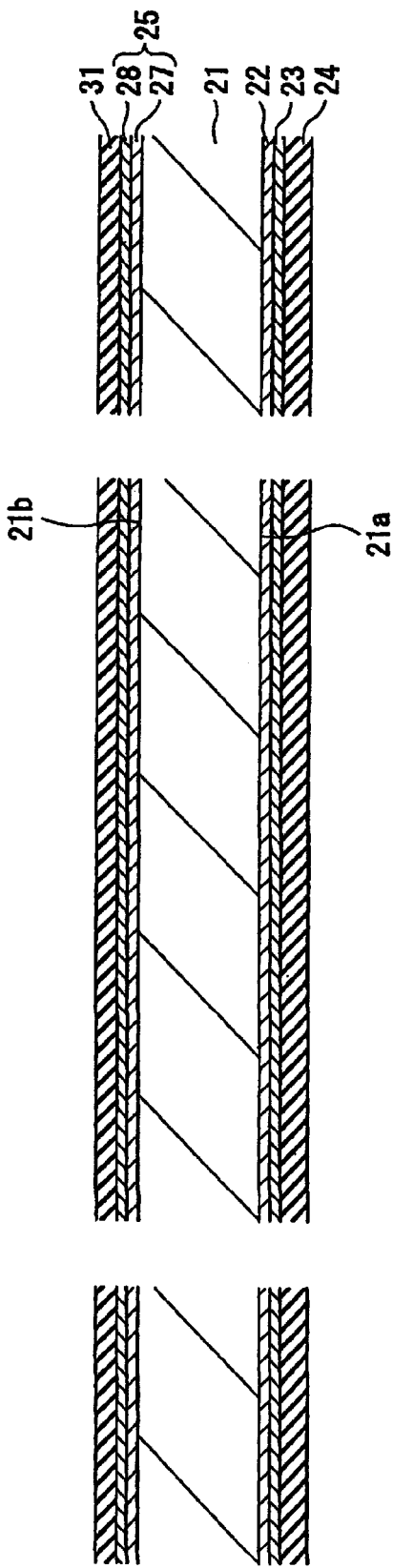
FIG. 13 is a cross sectional diagram showing a manufacturing process of a solar cell according to a preferred embodiment of the present disclosure.

As shown in FIG. 13, the i-type amorphous semiconductor layer 22, the n-type amorphous semiconductor layer 23, and the protection layer 24 are sequentially formed over the light receiving surface 21a of the substrate 21, and the n-type region 25 (the i-type amorphous semiconductor layer 27 and the n-type amorphous semiconductor layer 28) and the insulating layer 31 are sequentially formed over the back surface 21b. In this process, for example, a clean substrate 21 is placed in a vacuum chamber, and the layers are formed through CVD or sputtering. In addition, in this process, for example, the n-type region 25 and the insulating layer 31 are formed over the entire region other than an end edge region over the back surface 21b.

For the formation of the i-type amorphous semiconductor layers 22 and 27 through CVD, for example, material gas in which silane gas ($SiH_4$) is diluted with hydrogen ($H_2$) is used. In addition, for the formation of the n-type amorphous semiconductor layers 23 and 28, for example, material gas in which phosphine ($PH_3$) is added to silane gas ($SiH_4$) and the resulting gas is diluted with hydrogen ($H_2$) is used. By changing the hydrogen dilution ratio of the silane gas, it is possible to change the film characteristics of the i-type amorphous semiconductor layers 22 and 27 and the n-type amorphous semiconductor layers 23 and 28. In addition, by changing a mixture concentration of phosphine ($PH_3$), it is possible to change a doping concentration of the n-type amorphous semiconductor layers 23 and 28. For the formation of the protection layer 24 and the insulating layer 31 through CVD, for example, mixture gas of $SiH_4$/ammonia ($NH_3$) or $SiH_4$/nitrogen ($N_2$) is used as the material gas.

Figure 14:
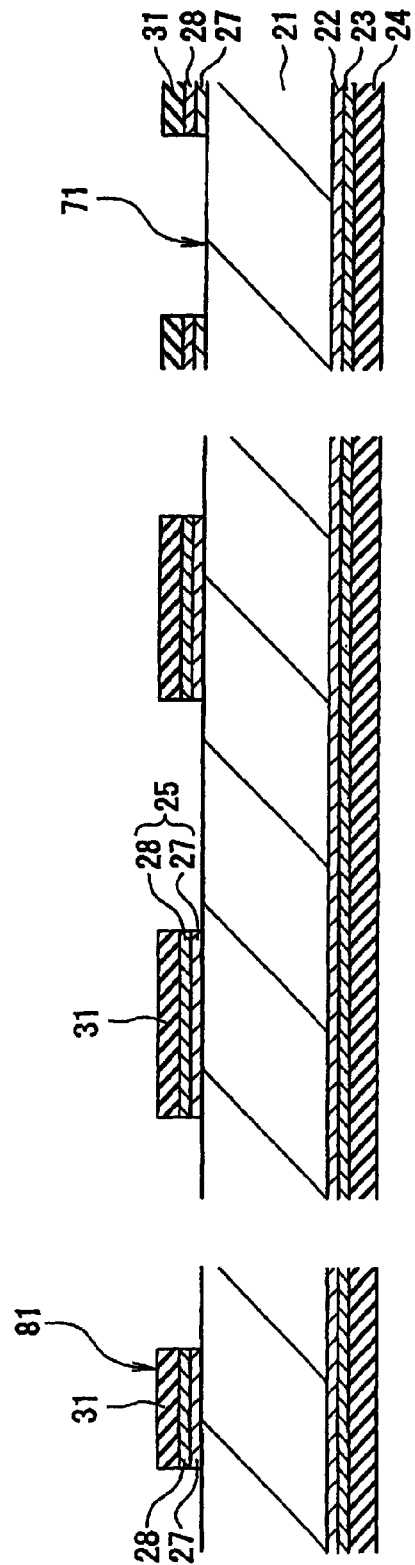
FIG. 14 is a cross sectional diagram showing a manufacturing process of a solar cell according to a preferred embodiment of the present disclosure.

Next, as shown in FIG. 14, the n-type region 25 and the insulating layer 31 formed over the back surface 21b are patterned. The patterning is executed by, for example, forming a target resist pattern over the insulating layer 31, and etching and removing a region which is not covered by the resist film and which is exposed. The insulating layer 31 can be etched, for example, using a hydrogen fluoride (HF) etchant. After the etching of the insulating layer 31 is completed, the resist film is removed, and the n-type region 25 which is exposed is etched using the patterned insulating layer 31 as a mask. The n-type region 25 can be etched, for example, using an alkaline etchant such as sodium hydroxide (NaOH) etchant (for example, NaOH etchant of 1 wt %).

With this process, the first patterned layer (patterned n-type region 25), the first mark 71 of the mark set 70, and the first mark 81 of the mark set 80 are formed. At this point, the insulating layer 31 formed in the same pattern as the n-type region 25 exists over the n-type region 25. In the mark set 70 formed in the n-type region 25, the first mark 71 is formed by etching and removing a part of the n-type region 25 and the insulating layer 31 to provide the recess. On the other hand, in the mark set 80 formed in the p-type region 26, the n-type region 25 and the insulating layer 31 are left in an island shape to form the first mark 81.

Figure 15:
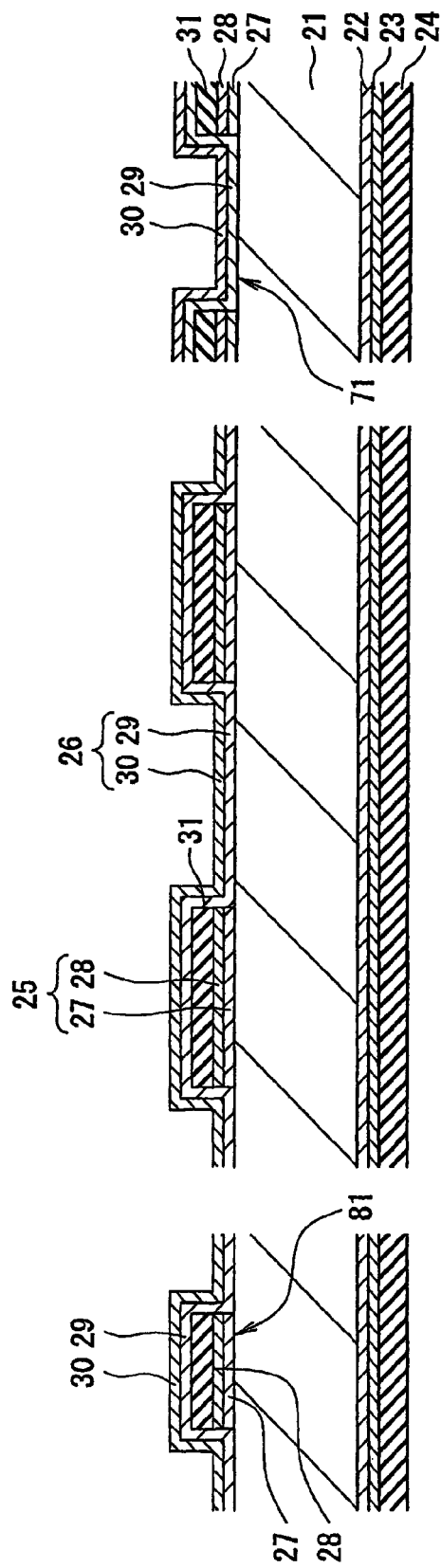
FIG. 15 is a cross sectional diagram showing a manufacturing process of a solar cell according to a preferred embodiment of the present disclosure.

Then, as shown in FIG. 15, the p-type region 26 (the i-type amorphous semiconductor layer 29 and the p-type amorphous semiconductor layer 30) is formed over the entire region other than an end edge region over the back surface 21b. The p-type region 26 is formed directly over the patterned insulating layer 31 and the back surface 21b. Similar to the n-type region 25, the p-type region 26 can be formed through CVD. However, for the formation of the p-type amorphous semiconductor layer 30 through CVD, for example, diborane ($B_2H_6$) is used as the doping gas in place of phosphine ($PH_3$).

Next, as shown in FIGS. 16-19, a part of the p-type region formed over the insulating layer 31 and a part of the insulating layer 31 are removed. With this process, a part of the n-type region 25 is exposed, to form a contact region between the n-type region 25 and the n-side electrode 40. In this step, first, the above-described part of the p-type region 26 is etched and removed, but for this process, the n-type region 25 and the p-type region 26 must be aligned.

Figure 17:
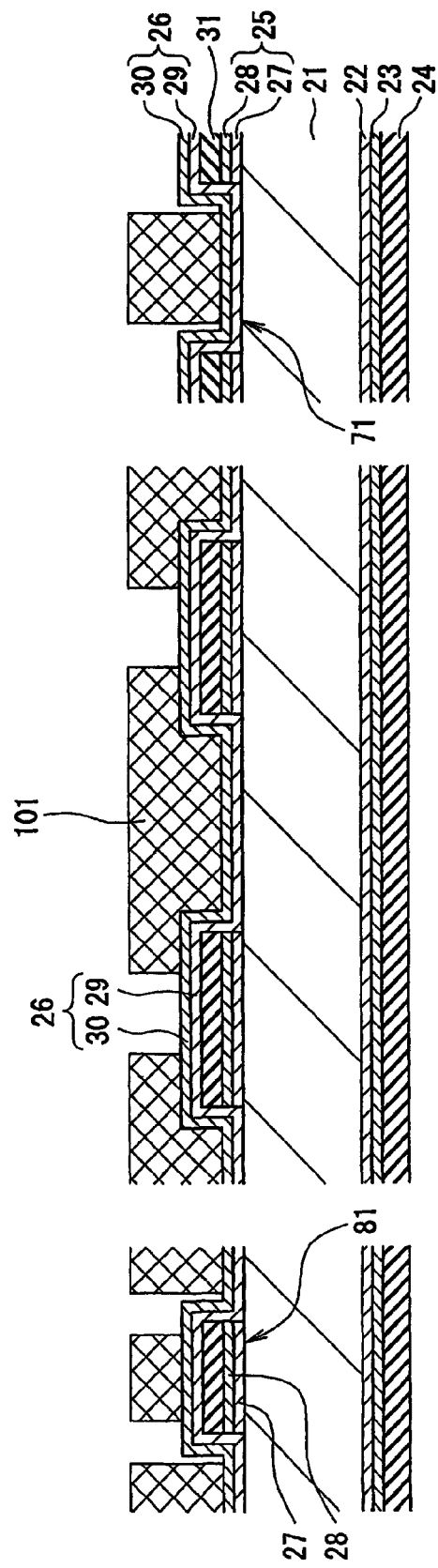
FIG. 17 is a cross sectional diagram showing a manufacturing process of a solar cell according to a preferred embodiment of the present disclosure.

First, a resist pattern 101 shown in FIG. 17 is created. As a method of patterning, various methods may be employed such as, for example, printing, photolithography, imprinting, direct drawing, and printing, photolithography, and imprinting in which a mask pattern is transferred. From the viewpoint of mass productivity, of these methods, printing, photolithography, and imprinting in which the mask pattern is transferred are desirable. In this description, the printing is employed.

Figure 16:
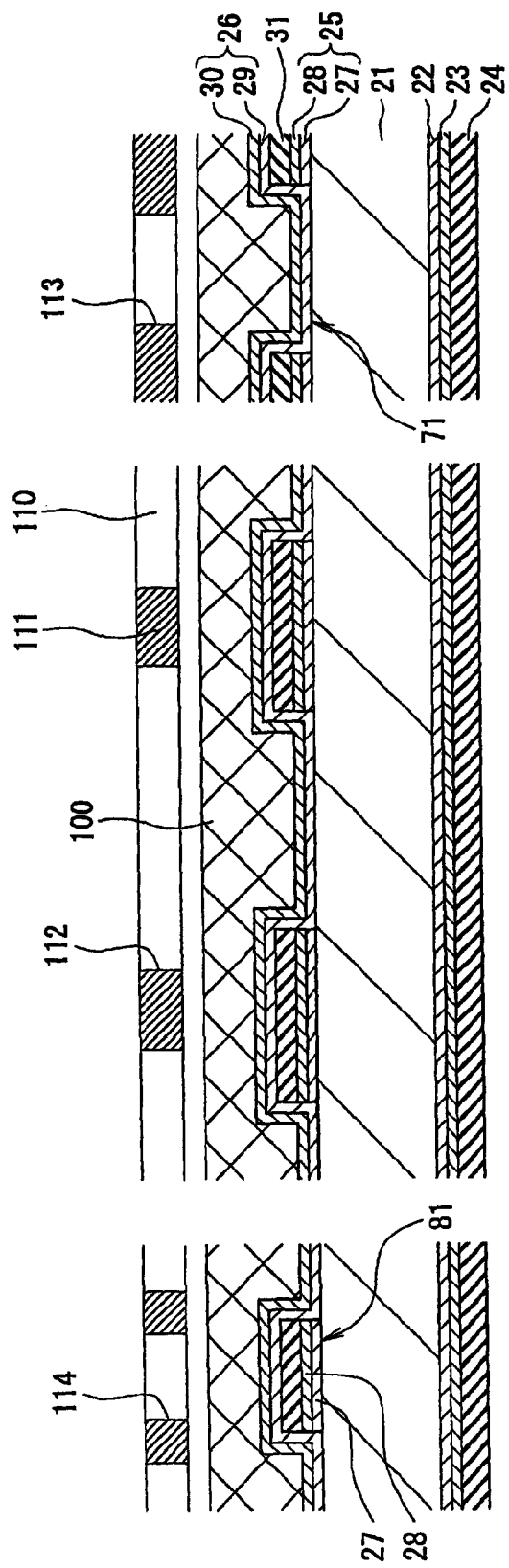
FIG. 16 is a cross sectional diagram showing a manufacturing process of a solar cell according to a preferred embodiment of the present disclosure.

As shown in FIG. 16, after a resist film 100 is formed over the entire region of the p-type region 26, the resist pattern 101 is formed thereover through printing. For the resist film 100, for example, a printing resist composition may be used. For a mask 110, for example, a mask having a protection section 111 corresponding to the above-described contact region may be employed. In other words, in the mask 110, an opening pattern 112 for forming the pattern of the p-type region 26, an opening pattern 113 for forming the second mark 72, and an opening pattern 114 for forming the second mark 82 are formed.

The mask 110 is placed such that the opening pattern 113 is positioned within the first mark without being placed out of the first mark 71, and such that the opening pattern 114 is positioned within the first mark 81 without being placed out of the first mark 81. In this process, for example, a step may be provided in which the mask 110 is placed such that an outline of the opening pattern 113 and the outline 71L of the first mark 71 do not contact each other, while actually checking the outlines. However, from the viewpoint of the productivity or the like, it is preferable to check the placement of the first mark 71 and the second mark 72 afterwards. Therefore, in this process, the placement of the mask 110 is adjusted using coordinate data of the first mark 71 and coordinate data of the opening pattern 113.

Figure 18:
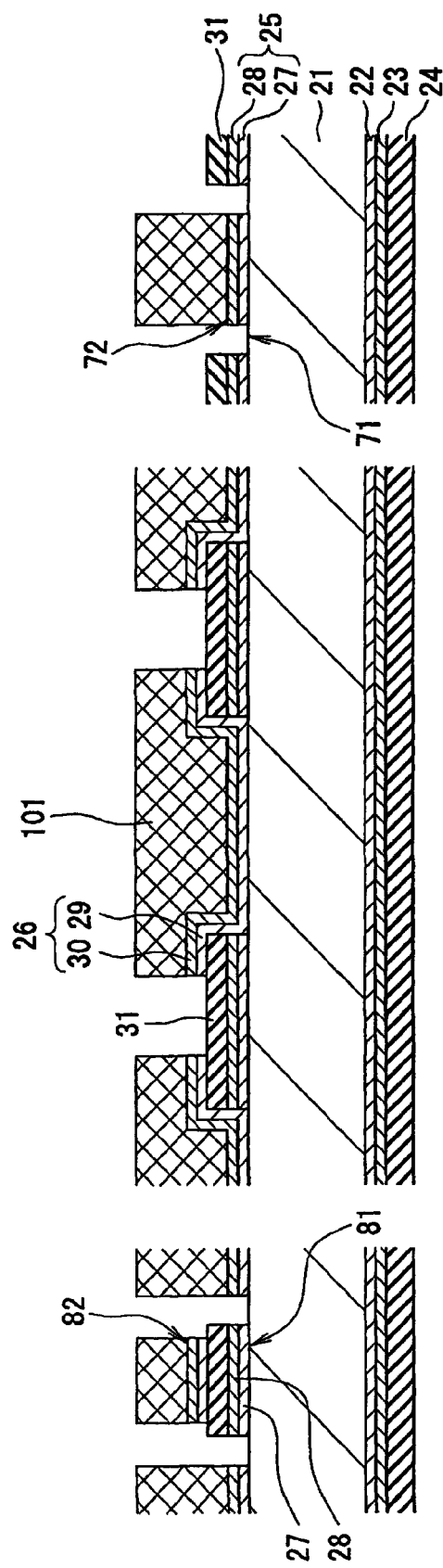
FIG. 18 is a cross sectional diagram showing a manufacturing process of a solar cell according to a preferred embodiment of the present disclosure.

Next, as shown in FIG. 18, using the created resist pattern 101, the above-described part of the p-type region 26 is etched and removed with an alkaline etchant such as the NaOH etchant. When the etching is executed as designed, the second mark 72 is formed within the first mark 71 and the second mark 82 is formed within the first mark 81. Because the p-type region 26 is normally more difficult to etch than the n-type region 25, for example, an etchant of a higher concentration (for example, NaOH etchant of 10 wt %) than the NaOH etchant used for etching the n-type region 25 is used.

Figure 19:
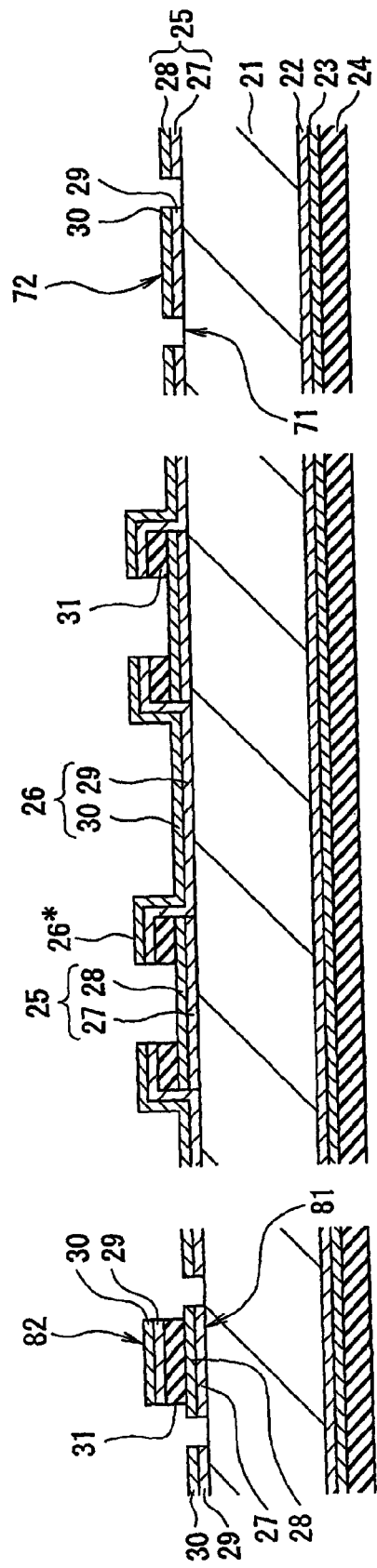
FIG. 19 is a cross sectional diagram showing a manufacturing process of a solar cell according to a preferred embodiment of the present disclosure.

Then, as shown in FIG. 19, for example, the resist pattern 101 is removed, and the insulating layer 31 is etched and removed using the patterned p-type region 26 as a mask. With this process, the insulating layer 31 remains only in a region between the n-type region 25 and the p-type region 26. In the mark set 80 also, the insulating layer 31 is patterned in the same shape as the p-type region 26.

Then, it is checked whether or not the second mark 72 is positioned within the first mark 71 without being placed out of the first mark 71, to judge the positional deviation between the n-type region 25 and the p-type region 26. Similar judgment is also executed for the second mark 82. More specifically, presence or absence of contact of outlines of the marks is measured, and the positional deviation is judged. In other words, the gap between the outlines of the marks is set as the tolerable value for the positional deviation.

Figure 20:
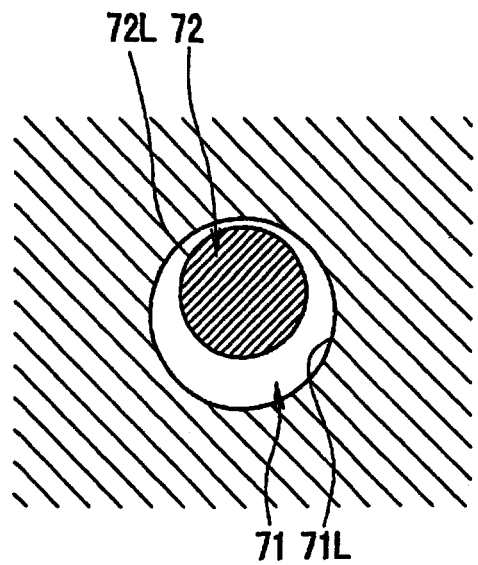
FIG. 20 is a diagram for explaining a method of judging a positional deviation between a first patterned layer and a second patterned layer in a manufacturing process of a solar cell according to a preferred embodiment of the present disclosure.
Figure 21:
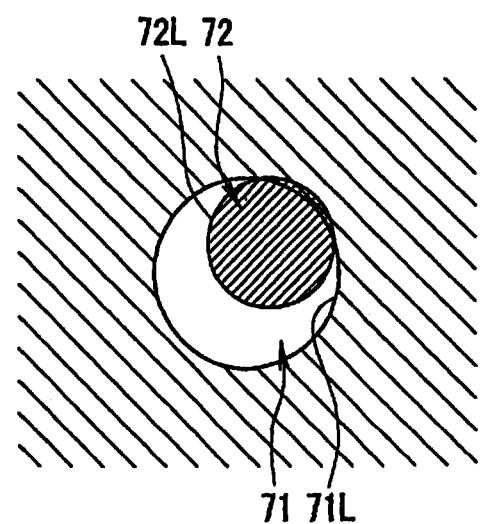
FIG. 21 is a diagram for explaining a method of judging a positional deviation between a first patterned layer and a second patterned layer in a manufacturing method of a solar cell according to a preferred embodiment of the present disclosure.

In this process, as shown in FIG. 20, even when the second mark 72 is significantly shifted from the center of the first mark 71, if it is confirmed that the outlines 71L and 72L do not contact each other and the outlines 81L and 82L do not contact each other, it is judged that the positional deviation between the n-type region 25 and the p-type region 26 is within the tolerable value. On the other hand, as shown in FIG. 21, for example, when the outlines 71L and 72L contact each other, the positional deviation is judged to be exceeding the tolerable value. When the positional deviation between the n-type region 25 and the p-type region 26 is judged as being within the tolerable value, the process proceeds to an electrode forming step, and, when the positional deviation is judged to exceed the tolerable value, for example, the product is appropriately handled as a deficient product.

The measurement of the mark placement may be, for example, automatically executed by image processing using an optical microscope. Alternatively, the mark placement may be observed by human eyes using the optical microscope. In this measurement, not only the presence or absence of the contact between the outlines of the marks may be checked, but also, the amount of deviation and direction of deviation may be checked. For example, the amount of deviation or direction of deviation of the second mark 72 with respect to the first mark 71 may be measured, and the measured value may be fed back to the placement process of the mask 110. Alternatively, in this process, a gap between outlines of the marks may be measured, and the positional deviation may be judged as being within the tolerable value when the measured value is greater than or equal to a threshold which is determined in advance.

The photoelectric conversion unit 20 can be manufactured through the process as described above. The n-side electrode 40 is then formed over the n-type region 25 of the photoelectric conversion unit 20 and the p-side electrode 50 is formed over the p-type region 26, to manufacture the solar cell 10. The n-side electrode 40 and the p-side electrode 50 are formed, for example, through a method exemplified below.

Figure 22:
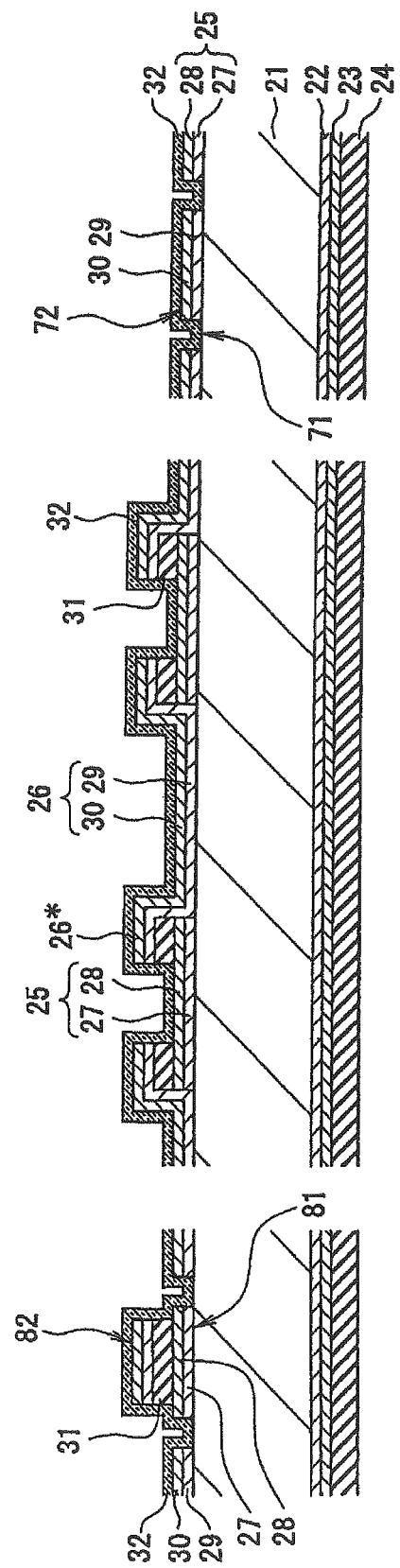
FIG. 22 is a cross sectional diagram showing a manufacturing process of a solar cell according to a preferred embodiment of the present disclosure.

First, as shown in FIG. 22, a transparent conductive layer 32 made of TCO is formed to cover the entire region over the n-type region 25, the p-type region 26, the first marks 71 and 81, and the second marks 72 and 82. The transparent conductive layer 32 may be formed, for example, through sputtering or CVD. In the transparent conductive layer 32, the separation groove 60 is formed in a later step, to separate the transparent conductive layer 32 into transparent conductive layers 43 and 53. In this process, the p-type region 26 and the transparent conductive layers 43 and 53 for forming the electrode layer must be aligned.

Figure 24:
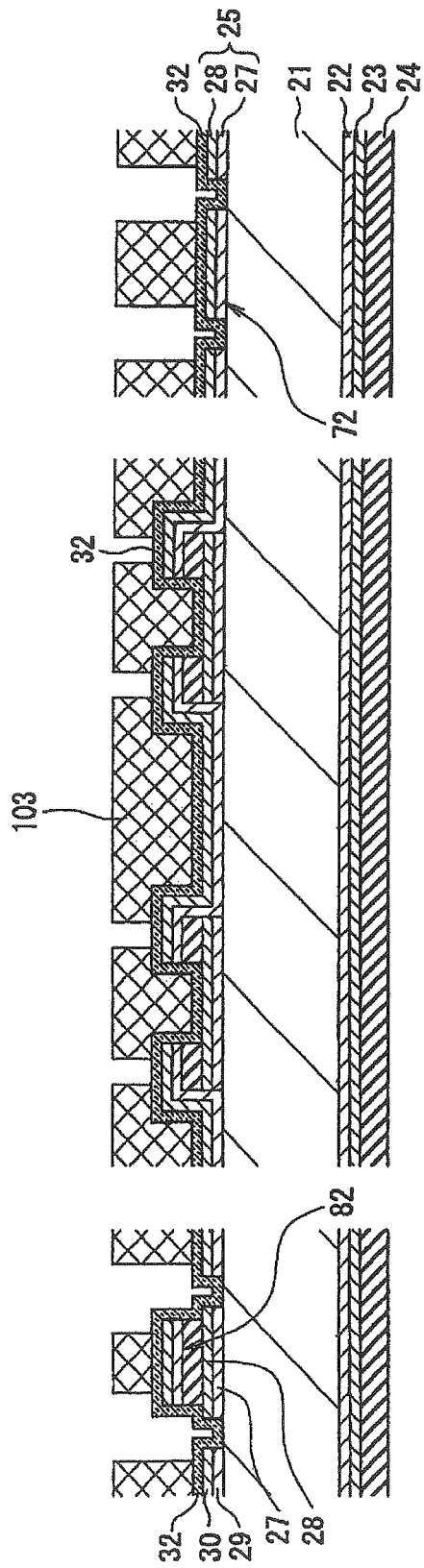
FIG. 24 is a cross sectional diagram showing a manufacturing process of a solar cell according to a preferred embodiment of the present disclosure.

Next, a resist pattern 103 shown in FIG. 24 is created. As the method of patterning, similar to the resist pattern 101, various methods may be used such as, for example, printing, photolithography, imprinting, direct drawing, and printing, photolithography, and imprinting in which a mask pattern is transferred. From the viewpoint of the mass productivity, printing, photolithography, and imprinting in which the mask pattern is transferred are desired. In this description, an example configuration is described which uses the printing.

Figure 23:
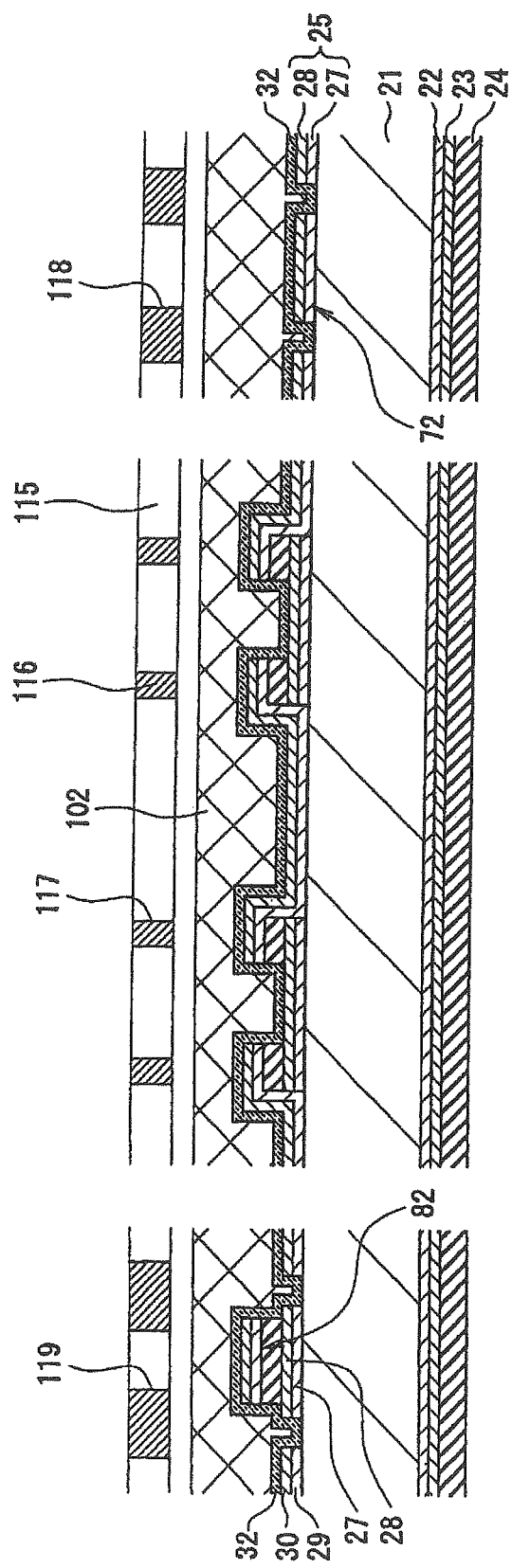
FIG. 23 is a cross sectional diagram showing a manufacturing process of a solar cell according to a preferred embodiment of the present disclosure.

As shown in FIG. 23, after a resist film 102 is formed over the entire region of the transparent conductive layer 32, the resist pattern 103 is formed thereover through printing. For the resist film 102, similar to the resist film 100, a printing resist composition may be used. For a mask 115, a mask in which a protection section 116 corresponding to the separation groove 60 is provided is used. In the mask 115, an opening pattern 117 which is a pattern for forming the pattern of the p-type region 26, an opening pattern 118 which is a pattern for forming the second mark 72, and an opening 119 which is a pattern for forming the second mark 72 are formed.

The mask 115 is placed such that the opening pattern 118 is positioned within the second mark 72 without being placed out of the second mark 72, and such that the opening pattern 119 is positioned within the second mark 82 without being placed out of the second mark 82. In this process, for example, a step may be provided to place the mask 115 so that an outline of the opening pattern 118 and the outline 72L of the second mark 72 do not contact each other while actually checking the outlines. However, similar to the patterning process of the p-type region 26, from the viewpoint of the improvement in the productivity or the like, it is preferable to adjust the placement of the mask 115 using the coordinate data of the second mark 72 or the like.

Figure 25:
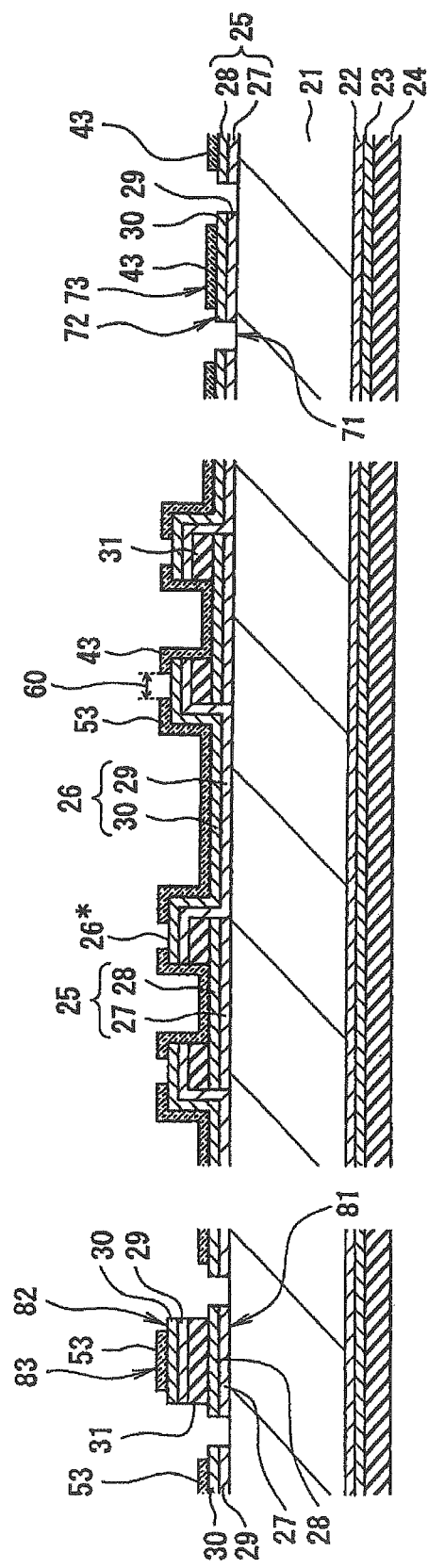
FIG. 25 is a cross sectional diagram showing a manufacturing process of a solar cell according to a preferred embodiment of the present disclosure.

Next, as shown in FIG. 25, using the created resist pattern 103, a part of the transparent conductive layer 32 is etched and removed with an alkaline etchant such as hydrogen chloride (HCl) etchant or oxalic acid etchant. With this process, the separation groove 60 is formed, the third mark 73 is formed within the second mark 72, and the third mark 83 is formed within the second mark 82.

Then, similar to the case of the second marks 72 and 82, it is checked whether or not the third marks 73 and 83 are positioned within the second marks 72 and 82 without being placed out of the second marks 72 and 82. With this process, presence or absence of the positional deviation between the p-type region 26 and the electrode layer is judged. Alternatively, the positional deviation judgment between the p-type region 26 and the electrode layer may be executed after the metal layers 44 and 54 are formed.

Finally, the metal layers 44 and 54 are respectively formed over the transparent electrode layers 43 and 53. The metal layers 44 and 54 may be formed through electroplating. In this case, it is preferable to form a seed layer for the plating in the same pattern as and over the transparent conductive layers 43 and 53. When a Cu-plated layer is to be formed as the metal layers 44 and 54, the seed layer is also preferably a Cu layer. Through the electroplating, the metal layers 44 and 54 (Cu-plated layers) are formed over the Cu seed layer. The electroplating may be executed, for example, by applying a current of the same size through a Cu seed layer for forming the n-side electrode 40 and a Cu seed layer for forming the p-side electrode 50. Over a surface of the Cu-plated layer, preferably, a protection layer for preventing oxidation of Cu and for preventing reduction of conductivity, such as, for example, a Sn-plated layer, is formed.

In the above-described exemplary manufacturing process, a plurality of steps for judging the positional deviation have been provided, but alternatively, the positional deviation judgment for the n-type region 25, the p-type region 26, and the electrode layer may be collectively executed after all of the layers have been formed. Moreover, in addition to or in place of the mark set 70 in which three marks are overlapped, as exemplified in FIG. 12, a mark set having the first mark and the second mark, and a mark set having the first mark and the third mark, may be formed. Similar to the above, in this case also, the positional deviation judgment may be collectively executed after all of the layers have been formed.

In addition, in the above-described exemplary manufacturing process, a mark set is exemplified in which the gap between the outlines of the marks are equal in a state where the centers of the marks coincide with each other, but alternatively, as exemplified in FIGS. 9 and 10, a mark set having different gaps may be formed. For example, the first mark and the second mark may be formed in shapes different from each other such that the gaps between the outlines of the marks differ from each other in one direction passing through the center and another direction orthogonal to the one direction, in a state where the center of the first mark and the center of the second mark coincide with each other in the planar view.

Alternatively, a plurality of mark sets may be formed in at least one of the n-type region 25 and the p-type region 26. The plurality of mark sets may be placed, for example, on a concentric circle, as exemplified in FIG. 11. Moreover, a plurality of mark sets may be formed having different gaps between the outlines of the marks.

As described, by judging the positional deviation of or aligning the n-type region 25, the p-type region 26, and the electrode layer using the mark sets 70 and 80, or the like, the solar cell 10 can be manufactured with a high efficiency. For example, positional deviation judgment which is stricter than necessary may be inhibited while maintaining the performance of the solar cell 10, to consequently improve the yield. In particular, in the case when the precision of alignment differs depending on the directions, the lengths of the mark may be changed depending on the directions, to further improve the yield.

The positional deviation judgment using the mark sets 70 and 80 is executed by a simple method of, for example, measuring presence or absence of contact between the outline 71L of the first mark 71 and the outline 72L of the second mark 72. Therefore, the analysis is easy, and can be achieved by observation with human eyes using the optical microscope. In addition to the observation with human eyes, the contact between the outline 73L of the third mark 73 formed by leaving the electrode layer (the transparent electrode layer 43 and the metal layer 44) with the island shape and the outline 72L of the second mark 72 can be easily judged by measuring a resistance value between the electrode layer of the third mark 73 and the electrode layer at an outer periphery of the second mark 72.

In addition to the above, the amount of deviation and direction of deviation of the patterned layers can be measured using the mark sets 70 and 80. In particular, by employing a circular shape, in the planar view, for the marks, the measurement of the amount of deviation and the direction deviation can be facilitated. Furthermore, with the use of a plurality of mark sets having different gaps between the outlines of the marks, more detailed and accurate judgment can be executed with a simple method.

What is claimed is:

1. A solar cell comprising:
    a first patterned layer formed over a semiconductor substrate;
    a second patterned layer formed over at least one of the semiconductor substrate and the first patterned layer; and
    a first mark set and a second mark set configured to judge a positional deviation between the first patterned layer and the second patterned layer, the second mark set being formed so as to not overlap the first mark set, wherein
    the first mark set comprises:
    a first mark formed by providing a recess on the first patterned layer or by leaving the first patterned layer with an island shape; and
    a second mark formed by providing a recess on the second patterned layer or by leaving the second patterned layer with an island shape, and formed to fit within the first mark;
    a first gap is provided between a first outline of the first mark and a second outline of the second mark;
    the second mark set comprises:
    a first mark formed by providing a recess on the first patterned layer such that the first mark of the second mark set does not overlap the first mark of the first mark set or by leaving the first patterned layer with an island shape; and a second mark formed by providing a recess on the second patterned layer such that the second mark of the second mark set does not overlap the second mark of the first mark set or by leaving the second patterned layer with an island shape, and formed to fit within the first mark of the second mark set; and a second gap not overlapping the first gap and having a distance different from that of the first gap is provided between a first outline of the first mark of the second mark set and a second outline of the second mark of the second mark set.

2. The solar cell according to claim 1, wherein at least the second mark of the first mark set and the second mark of the second mark set has a circular shape in a planar view.

3. The solar cell according to claim 1, wherein
a plurality of mark sets are formed, and
each of the mark sets is placed on a concentric circle on a planar view.

4. The solar cell according to claim 1, wherein
the first patterned layer is a first conductive type amorphous semiconductor layer, and
the second patterned layer is a second conductive type amorphous semiconductor layer.

5. The solar cell according to claim 4, wherein
an electrode layer formed over the first conductive type amorphous semiconductor layer and the second conductive type amorphous semiconductor layer is provided as a third patterned layer, and
the mark set includes a third mark formed by providing a recess on the electrode layer or by leaving the electrode layer in an island shape, and formed to fit within the second mark.

* * * * *